United States Patent
Wu et al.

(10) Patent No.: US 6,682,993 B1
(45) Date of Patent: Jan. 27, 2004

(54) EFFECTIVE VCC TO VSS POWER ESD PROTECTION DEVICE

(75) Inventors: Yi-Hsun Wu, Hsin-Chu (TW); Jian-Hsing Lee, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/161,007

(22) Filed: May 31, 2002

(51) Int. Cl.$^7$ .............................................. H01L 21/04
(52) U.S. Cl. ...................... 438/510; 438/514; 438/527; 438/305; 438/306
(58) Field of Search ................................ 438/514, 275, 438/233, 305, 306, 307, 199, 200, 592, 682, 510, 518, 519, 521, 527, 529; 257/328, 344

(56) References Cited

U.S. PATENT DOCUMENTS

| | | |
|---|---|---|
| 5,559,352 A | 9/1996 | Hsue et al. .................. 257/328 |
| 5,898,205 A | 4/1999 | Lee ............................ 257/355 |
| 5,929,493 A | 7/1999 | Wu ............................. 257/369 |
| 5,953,601 A | 9/1999 | Shiue et al. ................. 438/200 |
| 6,514,839 B1 * | 2/2003 | Ker et al. .................... 438/514 |

* cited by examiner

*Primary Examiner*—Amir Zarabian
*Assistant Examiner*—Khanh B. Duong
(74) *Attorney, Agent, or Firm*—George O. Saile; Stephen B. Ackerman

(57) ABSTRACT

The invention consists of an ESD protection discharging NMOS with a special drain dopant region that enables a lower voltage trigger point for Vcc to Vss ESD power protection. To enable this ESD protection, the NMOS source connected to a first voltage bus line, or Vcc, and the drain is connected to a second voltage bus line, or ground. The NMOS device gate is connected to ground through a diffused resistor assuring the device remains in an off state during normal operation. The unique invention special dopant region is located under and around the NMOS drain which lowers the drain to substrate breakdown voltage enabling the ESD protection current discharge to start at a lower voltage than otherwise. This feature reduces voltage stress on the gates of active devices being protected, and enables higher ESD current discharges at the same power level as for devices without the special drain dopant region.

7 Claims, 3 Drawing Sheets

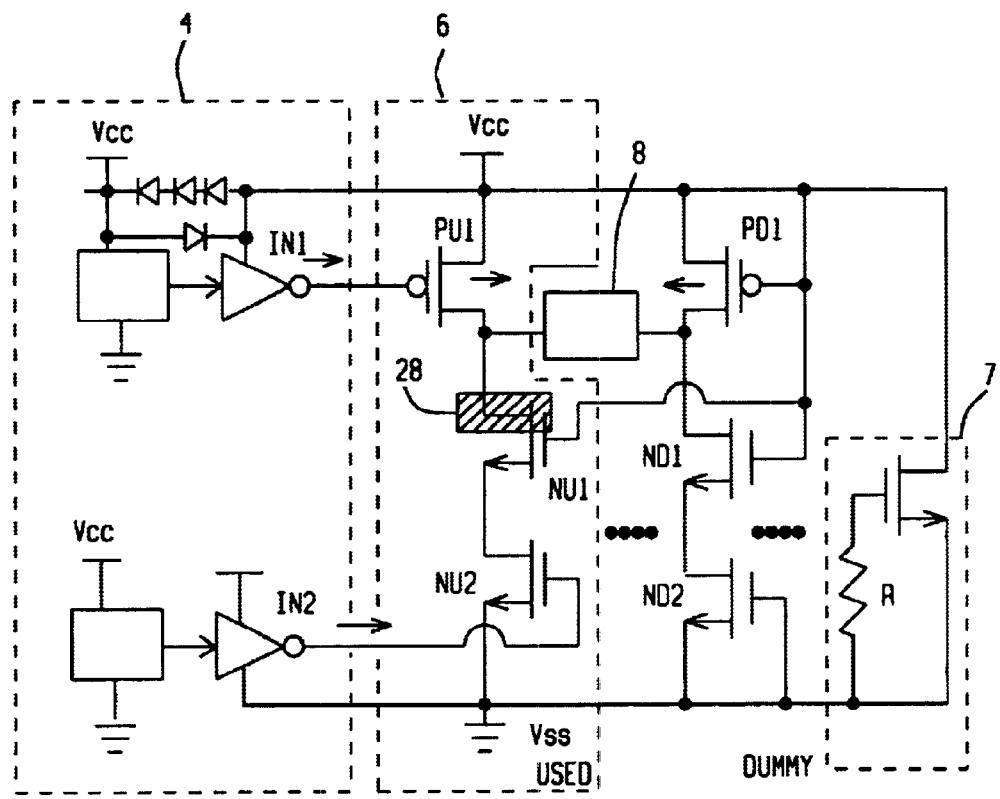
FIG. 1A – Prior Art
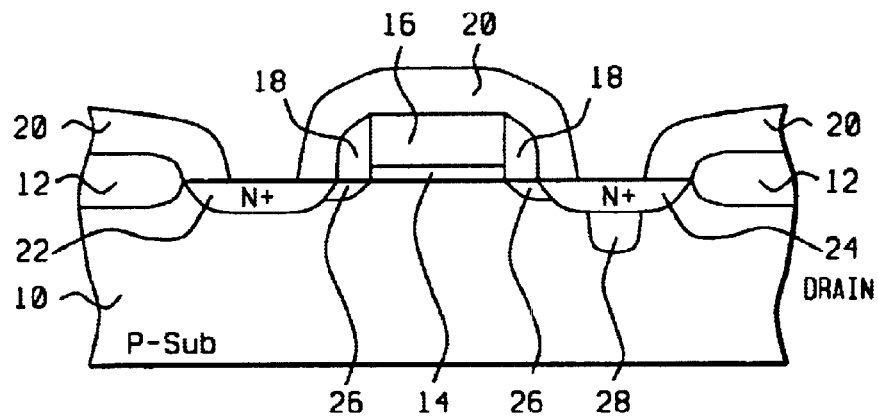
FIG. 1B – Prior Art

EFFECTIVE VCC TO VSS POWER ESD PROTECTION DEVICE

BACKGROUND OF THE INVENTION

(1) Field of the Invention

The present invention relates generally to a structure of and manufacturing process for a semiconductor device which provides improved ESD protection of active semiconductor devices and more particularly to a Vcc to Vss protection element for complimentary metal oxide semiconductor (CMOS) circuit configuration.

(2) Description of Prior Art

Because of high input impedance and thin oxide gate structures, the problem of Electrostatic Discharge (ESD) damage with field effect transistor (FET) devices can be severe. Therefore the input/output I/O circuit locations or pads usually have a protective device connected between the I/O pad and the internal circuits which allows the ESD current to be shunted to ground. Another important characteristic of the ESD protection device is that it must not interfere with the operation of the devices it is designed to protect, while at the same time providing good protection when abnormal or ESD voltage incidents occur.

A representative logic circuit with prior art ESD protection for the I/O logic circuitry is shown in FIG. 1A. Section 4 in FIG. 1A shows the logic output pre-driver section, with outputs IN1 and IN2 feeding the driver and internal logic ESD protection string 6. IN1 feeds the gate of used P channel metal oxide semiconductor (PMOS) PU1 which is on for low IN1 signals presenting a high voltage of approximately Vcc at the I/O pad 8. Output IN2 feeds the gate of a N channel metal oxide semiconductor (NMOS) NU2 which, when IN2 is high, is on presenting a low voltage to I/O pad 8.

The typical logic I/O ESD protection device consists of a NMOS NU1 with the drain connected to the I/O pad 8. A parasitic NPN bipolar device, not shown in FIG. 1A, is essentially in parallel with the NMOS device and has a collector base junction breakdown triggered by the ESD voltage. A P– dopant region 28 beneath the N+ drain region of NU1 has the effect of reducing the collector base junction breakdown voltage. Once triggered by an ESD incident, the parasitic device operates in a secondary breakdown mode to clamp the ESD voltage to a suitable level and pass the high current to a second voltage source Vss, typically ground. Section 7 in FIG. 1A represents a conventional Vcc to Vss ESD NMOS protection device without any special diffusions in its elements.

A typical N channel logic and I/O FET protection device cross section is depicted in FIG. 1B. An N-channel FET is situated on a P-substrate 10. The device consists of field oxide isolation (FOX) regions 12, a gate structure consisting of a conducting element 16 typically polysilicon, with a gate insulation oxide 14, and oxide spacers 18. The gate and FOX are shown covered with an insulation layer 20, typically silicon oxide ($SiO_2$) or borophosphosilicate glass (BPSG). Not depicted for clarity are the electrical contact and conductor details. The source 22 and drain 24 elements consist of lightly doped N regions (LDD) 26 and heavily doped N+ regions for source 22 and drain 24. Incorporated beneath the N+ drain region 24 is a P– region 28 which is typically created by implanting boron through the pre-metal contact openings.

The P dopant concentration in the P– area 28 is higher than that in the substrate in general. Junction breakdown is inversely proportional to the impurity concentration. Therefore, the P– region lowers the drain to substrate junction breakdown voltage by increasing the substrate impurity concentration at the junction boundary. This effect enhances the ESD protection of the device. Note that the P– region 28 in prior art is contained near the center of the drain region 24 in a region smaller than the drain region 24 and does not approach the drain areas near the edge of the gate.

In addition to the specific diffusion design of the conventional ESD protection device, the conventional prior art device is placed to protect ESD events with respect to the I/O pad.

Often overlooked is the need for improved ESD protection between the power buses, typically called Vcc and Vss. ESD voltages and energy can be coupled to the Vss bus, and can cause high channel current for devices in the "on" state as well as cause high gate stresses for devices in electrical proximity to the Vss bus. The result is degradation in overall IC chip and circuit ESD protection performance.

The invention describes a method and ESD IC power bus protection device with enhanced ESD protection capability.

The following patents describe ESD protection devices.

U.S. Pat. No. 5,898,205 (Lee) describes an ESD protection circuit using NMOS and PMOS devices.

U.S. Pat. No. 5,953,601 (Shiue et al.) discloses an ESD implantation step using boron. The ion implantation is spaced from the polysilicon gate.

U.S. Pat. No. 5,929,493 (Wu) teaches a CMOS process using blanket, low dose boron implant to adjust Vth for ESD protection devices.

U.S. Pat. No. 5,559,352 (Hsue et al.) discloses a method to improve an ESD protection device using ion implantation. The implantation is spaced from the polysilicon gate.

SUMMARY OF THE INVENTION

Accordingly, it is the primary objective of the invention to provide a novel, effective device structure, and a device development method, for protecting integrated circuits from damage caused by ESD events occurring during circuit operation, in particular for ESD events between Vcc and Vss power lines.

In addition, it is an objective of this invention to provide this ESD protection while maintaining appropriate normal circuit operating parameters of the devices being protected.

It is yet another object of the invention to provide a process method for forming the ESD protection structure that is fully compatible with the manufacturing process of the devices being protected.

The above objectives are achieved in accordance with the embodiments of the invention that describes a process and novel structure for a ESD protection NMOS FET device for the integrated circuit (IC) power bus elements, typically known as Vcc and Vss. A NMOS FET device is created between the Vcc and Vss power buses with the source connected directly to Vss, or ground. The device gate is connected to Vss through a resistor and the device drain is connected to Vcc.

A particularly unique feature of the invention is an acceptor specie implant, typically boron, into the device drain region. This implant produces a P– region around and below the N+ device drain and extends into proximity of, or has a small overlap with the gate channel area. As previously noted, the junction breakdown voltage is inversely proportional to the doping levels at the junction boundary region. The special acceptor implant produces a N– region of higher concentration than the substrate, and hence reduces the breakdown voltage of the P-N junction. This allows for a higher ESD discharge current for a given power, since power is a product of current times voltage. Since the device is placed between the voltage buses, junction capacitance is not as critical a factor as it is for the active logic circuits.

A NPN parasitic bipolar transistor exists in parallel with the NMOS device, with the collector formed with the NMOS drain, the P base formed by the P substrate, and the collector formed with the NMOS drain. A high voltage from an ESD event on the Vcc power bus causes the PN collector junction to breakdown, raising the substrate voltage providing positive base voltage further enhancing turn on of the parasitic NPN transistor causing the ESD current to be shunted to Vss preventing damage to the active devices. In addition, if the ESD energy is sufficient, hot carrier tunneling will occur causing a positive voltage to appear on the NFET gate also turning on that device shunting additional ESD current to Vss.

The gate of the NMOS ESD device is connected to Vss or ground through a resistor, assuring that the device is in the off state during normal circuit operation and therefore it does not impact normal circuit operation.

BRIEF DESCRIPTION OF THE DRAWINGS

FIG. 1A is a schematic of prior art I/O string ESD protection device.

FIG. 1B is a cross section representation of a conventional prior art NMOS ESD logic protection device showing a limited implant of opposite dopant under the drain region of the logic protection device.

DESCRIPTION OF THE PREFERRED EMBODIMENTS

Figure 2A:
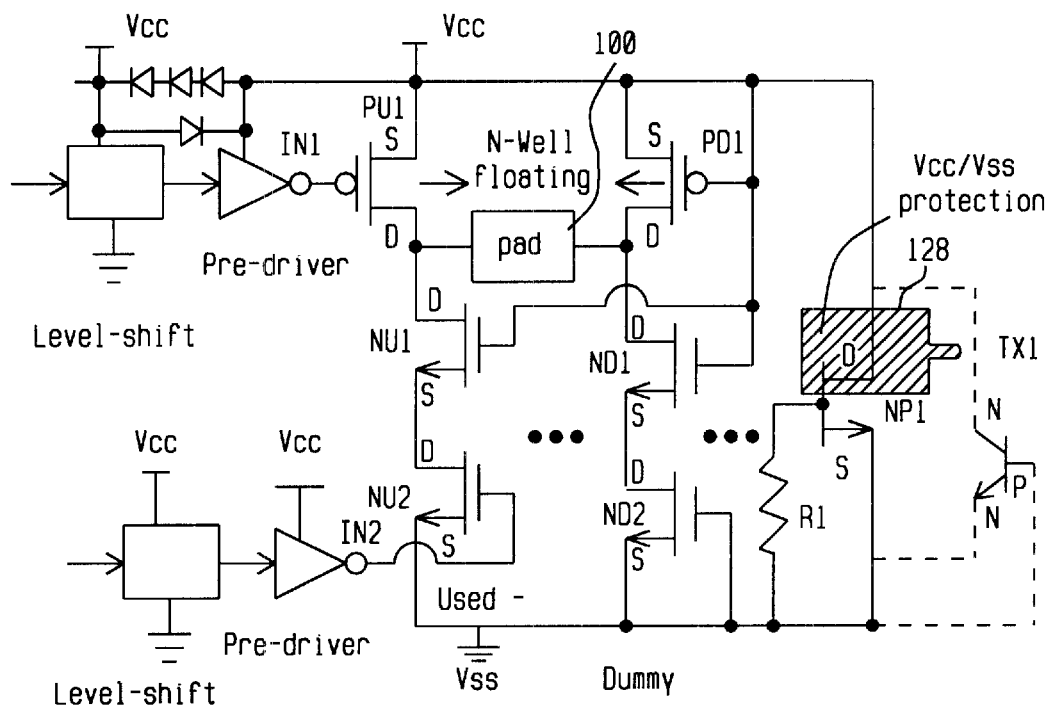
FIG. 2A is a schematic representation of the invention showing the "used" I/O string and the "dummy" I/O string, with a unique NMOS ESD bus protection device with special drain implant.

FIG. 2 shows in schematic form the invention as embodied by a cascaded complimentary CMOS circuit string. The first string is the "used" or active string. It consists of a PMOS PU1 with the source connected to Vcc, a voltage typically between 2.5 and 5.0 volts, and the gate connected to an internal logic signal line IN1.

The drain is connected to the I/O pad 100 and to the drain of the cascaded first "used" NMOS NU1. The cascaded NMOS NU1 has its gate tied to Vcc and the source connected to the drain of the second "used" NMOS NU2. The source of NMOS NU2 is connected to ground while the gate is connected to a internal logic signal line IN2. The number of active strings is not limited to only one series connected complimentary cascaded string. The output current is a function of string current drive capability and the number of "used" or active strings in parallel connected to the same output pad. It is estimated that each active output string can supply between 2 and 48 milliamperes (ma) of output current.

In parallel with the "used" active string is an unused or dummy string consisting of a PMOS PD1 with gate and source connected to Vcc, and drain connected to the I/O pad 100, and the cascaded NMOS ND1 drain. The gate of cascaded NMOS ND1 is connected to Vcc and the source is connected to the drain of NMOS ND2. The gate and source of the second NMOS ND2 are connected to ground.

During normal circuit operation, a high logic signal from the internal circuits will turn on the device NMOS NU2, essentially pulling down the voltage at the I/O pad 100 to ground, as the cascade device NMOS NU1 with the gate tied to Vcc is essentially always on.

Also, with the logic signal line high, "used" PMOS PU1 is turned off, assuring no current will flow except during the switching cycle.

Conversely, when the internal logic signal is low, NMOS device NU2 will be turned off and PMOS device PU1 will be turned on, providing a voltage at or near Vcc to be placed on the output pad 100. Again, current will only flow during the switching cycle.

Power bus ESD protection NMOS device NP1 is a key feature of the embodiment of the invention. The protection NMOS NP1 drain is connected to the first voltage source, Vcc, and the device source is connected to a second voltage source Vss, typically ground. The protection NMOS NP1 gate is connected to the first side of a resistor R1, and the second side of the resistor R1 is connected to the second voltage source, Vss. The resistor typically has a value of between 1 and 100 K ohms and assures that the protective NMOS device NP1 is in the "off" state during normal circuit operation. Another significant aspect of the invention is that ESD protection NMOS NP1 device has a special dopent region 128 under and around the normal drain diffusion region of opposite dopant than the N+ drain diffusion.

This special dopent region 128 of opposite dopant to the N+ drain, and therefore of similar dopant to the substrate, but of higher concentration, reduces the breakdown voltage of the P-N substrate-drain junction, which also forms the base collector junction of a parasitic NPN bipolar transistor TX1 electrically in parallel with NMOS NP1. During an ESD voltage event on the Vcc bus, a higher than normal voltage will be placed on Vcc and therefore the drain of NP1 and the collector of parasitic transistor TX1. TX1 will go into breakdown mode at some point preventing the ESD voltage from going higher and providing a discharging means for ESD energy to ground. The reduction in drain-substrate junction breakdown voltage provided by the special dopant region 128, and therefore also the collector base junction breakdown voltage, allows current to flow into the substrate P base region at a lower voltage than otherwise. This current flow will raise the base voltage and turn on the parasitic transistor TX1. It must be noted that the special dopant region 128 is larger than in prior art, extending under and around the full NP1 drain dopant region.

When the ESD voltage is removed, the protection NMOS NP1 will return to its normal off state as assured by the gate being connected to ground through the resistor R1. This off state draws no power from the device power bus, and prevents the protection device from interfering with normal circuit operation.

Figure 2B:
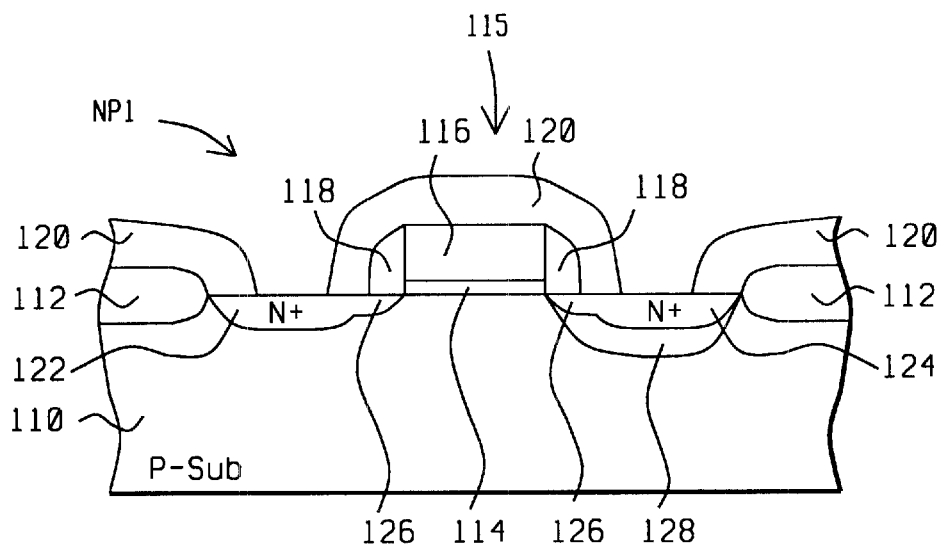
FIG. 2B is a cross section of the NMOS bus ESD proteection device with special drain implant.

FIG. 2B shows a representative cross section of the Vcc to Vss power ESD protection device NP1 with special drain diffusion. A P doped substrate of between 1E14 to 1E15 atoms per cubic centimeter (a/cm$^3$) is patterned by convention means such as using photoresist in conjunction with other suitable masks such as silicon nitride SiN) to define active circuit areas. Thick field oxide (FOX) 112 is thermally grown with process temperatures typically between 700 and 1200 degrees centigrade to a thickness between 4000 and 10000 angstroms (Å).

A gate oxide insulation layer is formed by the thermal growth of the silicon substrate as is well known in the art, to a thickness of between 70 and 350 Å. A gate conduction layer 116 is deposited conformally, typically polysilicon (poly) or polycide to a thickness of between 1500 and 4500 Å. The gate poly conduction layer 116 is typically doped with an donor element such as phosphorous (P) to a resultant concentration of 1E18 to 1E21 a/cm$^3$ to improve conductivity. The gate layer is then patterned by conventional lithography followed by etching to form the gate structure 115 consisting of gate oxide 114 and gate conductor element 116.

A first ion implant using the gate structure 115 as a mask is performed using phosphorous P31 at a concentration between 1E13 and 1E14 a/cm$^2$. This forms the N– regions 126 known as lightly doped drain extensions (LDD) with typical dopant density of between 1E16 and 1E18 a/cm$^3$. A conformal insulating layer of SiO$_2$ or other suitable insulator such as SiN is deposited over the entire surface by chemical vapor deposition (CVD) to a thickness of between 1000 and 3000 Å. The layer is patterned and etched by an anisotropic reactive ion etch to form spacers 118 on the sides of the device gate 115.

A heavy ion implant is now performed, using arsenic AS75 at a dosage of between about 1E15 and 1E16 a/cm$^2$. A drive in step is typically performed at a temperature of between 750 and 950 degrees centigrade for between 10 and 60 minutes. This results in the heavily doped source region 122 and drain region 124 with a resultant dopant concentration of between 1E19 and 1E121 a/cm$^3$.

A key step to the invention is now performed. The device is patterned with conventional lithography to mask all areas except the device drain 124. An implant is performed using an acceptor dopant such as boron B11 with a dosage concentration of between 1E13 and 1E14 a/cm$^2$ and an implant energy of between 10 and 80 KeV. This results in an imbedded doped region 128 under the drain region 124 with a typical dopant density of between 1E16 and 1E19 a/cm$^3$. This feature reduces the junction breakdown characteristic of the Vcc to Vss power ESD protection device NP1 greatly enhancing the protection capability.

An insulating layer 120 of SiO$_2$ or BPSG other suitable insulating material is now formed over the entire structure to a thickness between 2000 and 8000 Å. The layer is patterned by conventional photolithography and etched to form contact openings to the substrate surface for the source region 122 and drain region 124.

Device processing is continued to completion. This includes a blanket metal evaporation to form the electrical conductor system. Patterning and etching to form the source 122 and drain 124 electrical conductors follow the blanket evaporation. The drain conductor is connected to the first voltage source, Vcc. The drain electrical conductor is conneccted to the second voltage source, Vss.

The gate conductor element can be a metal system of aluminum or doped aluminum, or a doped polysilicon conductor element.

The gate conductor is connected to one side of a diffused resistor which has a value between 1000 and 100,000 ohms. The other side of the resistor is connected to the second voltage source, Vss or ground.

The improvements provided by this unique protection device circuit under ESD testing are shown in Table 1. The ESD test voltage as represented by the Human Body Model (HBM)-shows a nominal 3.5 times improvement for the invention device over a conventional previous art design.

TABLE 1

Test Result for Conventional vs. Special Diffused Bus protection Device

| Device Level | HBM |
| --- | --- |
| Conventional Protected Bus I/O | 600 V |
| Special Diffused NMOS Bus protected I/O | 2.1 KV |

Figure 3:
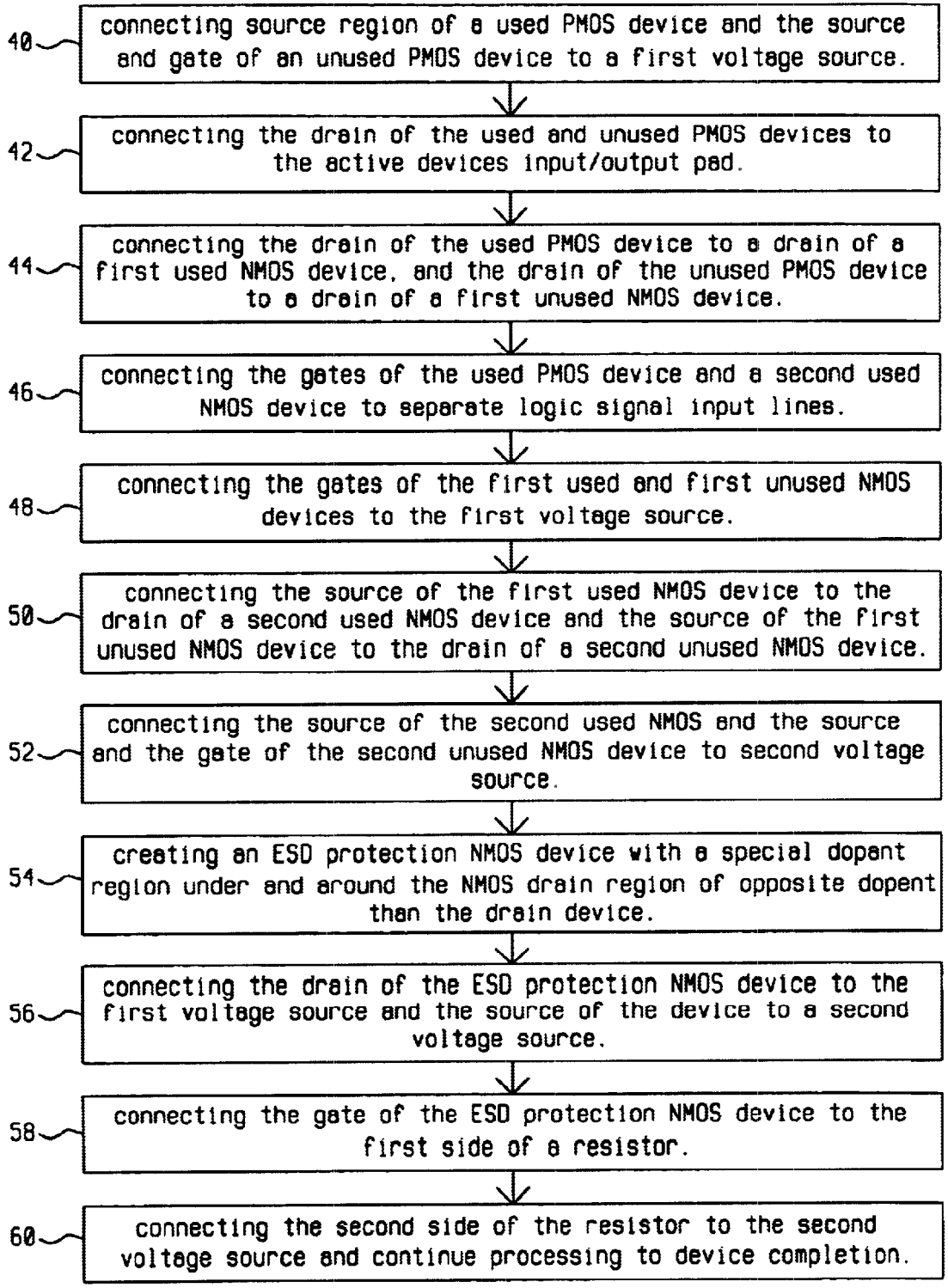
FIG. 3 is a flow diagram of the method of developing the special NMOS ESD protection circuit for stacked NMOS ESD power bus protection.

The method for creating the improved Vcc to Vss power protection device is illustrated in FIG. 3. As shown in element 40 of the flow diagram, connecting the source of the used PMOS device and the source and gate of the unused PMOS to the first voltage source, typically Vcc, can initiate the method. It is continued as indicated in FIG. 3 element 42 by connecting the drains of the used and unused PMOS devices to the stacked NMOS input/output pad. Continue as indicated in element 44 by connecting the drain of the used PMOS device to the drain of a first used NMOS device, and connecting the drain of the unused PMOS device to the drain of a first unused NMOS device. Element 46 indicates the connecting of the gate of the used PMOS device and the gate of the second used NMOS device to separate internal circuit logic signal lines continues the method.

Element 48 shows the connecting of the gates of the first used and unused NMOS devices to a first voltage source, Vss. Element 50 continues the process by connecting the source of the first used NMOS to the drain of the second used NMOS and connecting the source of the first unused NMOS device to the drain of the second unused NMOS device. Element 52 depicts connecting the source of the second used NMOS and the source and the gate of the second unused NMOS device to a second voltage source, typically ground.

The ESD protection capability is provided as shown in FIG. 3 element 54 by creating an ESD protection NMOS device with a special dopant region under and around the NMOS normal drain region and of opposite dopant than the N+ drain region. The special dopant region is typically created by suitably patterning the device with a masking element such as photoresist that covers the device except for the exposed drain area. Then an implant is performed typically using a boron ion implant source with a dopant concentration of between 1E13 and 1E14 a/cm$^2$ and an implant energy of between 10 and 80 KeV to produce a P– region of between E16 and E19 a/cm$^3$. The process is continued as indicated in element 56 by connecting the drain of the ESD protection NMOS device to the first voltage source, Vcc, and the drain to a second voltage source, Vss or ground. The method continues in element 58 by connecting the gate of the ESD protection NMOS device to the first side of a resistor and completed as indicated in element 60 by connecting the second side of the resistor to the second voltage source Vss.

While the invention has been particularly shown and described with reference to the preferred embodiments thereof, it will be understood by those skilled in the art that various changes in form and details may be made without departing from the spirit and scope of the invention.

What is claimed is:

1. A method of forming a protection circuit for protecting integrated semiconductor active devices from damage due to ESD voltages appearing on the circuit power bus lines said method comprising:

connecting source region of a used PMOS device and the source and gate of an unused PMOS device to a first voltage source;

connecting the drains of said used and unused PMOS devices to the active devices input/output pad;

connecting the drain of said used PMOS device to a drain of a first used NMOS device, and the drain of said unused PMOS device to a drain of a first unused NMOS device;

connecting the gate of said used PMOS device and the gate of a second used NMOS device to separate logic signal lines;

connecting the gates of said first used and said first unused NMOS devices to said first voltage source;

connecting the source of said first used NMOS device to the drain of said second used NMOS device and connecting the source of said first unused NMOS device to the drain of a second unused NMOS device;

connecting the source of said second used NMOS device and the source and gate of said second unused NMOS device to a second voltage source;

and connecting an ESD discharging means for discharging ESD energy appearing between said first and second voltage source, wherein said ESD protection discharging means comprises a discharging NMOS device with a special dopant region under and around said device normal drain region of opposite dopant than the normal drain region, and a resistor with a value between 1,000 and 100,000 ohms.

2. The method according to claim 1 wherein said ESD protection discharging means is connected to the circuits to be protected by connecting said drain of said discharging NMOS device to said first voltage source and connecting the source of said discharging NMOS to said second voltage source.

3. The method according to claim 1 wherein said ESD protection discharging means is connected to the circuits to be protected by connecting the gate of said discharging NMOS device to the first end of said resistor and connecting the second end of said resistor to said second voltage source.

4. The method according to claim 1 wherein said special dopant region under and around said discharging NMOS device normal drain region is created by an ion implant of boron with a dosage between 1E13 and 1E14 a/cm$^2$ and an energy of between 10 and 80 KeV, to produce a resultant dopant concentration of between 1E16 and 1E19 a/cm$^3$.

5. The method according to claim 1 whereby said first voltage source is generated to a positive level above ground designated Vcc with a value between 2.5 and 5 volts.

6. The method according to claim 1 whereby said second voltage source designated Vss is connected to a voltage level below Vcc, typically ground.

7. The method according to claim 1 whereby said separate logic signal lines are connected to internal logic devices.

* * * * *